United States Patent
Chi et al.

(10) Patent No.: US 7,547,636 B2
(45) Date of Patent: Jun. 16, 2009

(54) PULSED ULTRA-HIGH ASPECT RATIO DIELECTRIC ETCH

(75) Inventors: Kyeong-Koo Chi, Pleasanton, CA (US); Erik A. Edelberg, Castro Valley, CA (US)

(73) Assignee: Lam Research Corporation, Fremont, CA (US)

( * ) Notice: Subject to any disclaimer, the term of this patent is extended or adjusted under 35 U.S.C. 154(b) by 9 days.

(21) Appl. No.: 11/671,342

(22) Filed: Feb. 5, 2007

(65) Prior Publication Data

US 2008/0188082 A1 Aug. 7, 2008

(51) Int. Cl.
 *H01L 21/302* (2006.01)
(52) U.S. Cl. .................. 438/714; 438/710; 438/723; 438/724; 438/725; 216/67; 216/68; 216/72; 216/74; 216/81
(58) Field of Classification Search ................. 438/714; 216/67
See application file for complete search history.

(56) References Cited

U.S. PATENT DOCUMENTS

| | | | |
|---|---|---|---|
| 4,687,543 A | 8/1987 | Bowker | |
| 5,843,847 A * | 12/1998 | Pu et al. ................ | 438/723 |
| 6,147,005 A | 11/2000 | Tu et al. | |
| 6,284,149 B1 * | 9/2001 | Li et al. ................ | 216/64 |
| 6,368,974 B1 | 4/2002 | Tsai et al. | |
| 6,617,253 B1 | 9/2003 | Chu et al. | |
| 6,759,340 B2 | 7/2004 | Nallan et al. | |
| 2001/0051438 A1 | 12/2001 | Shin et al. | |
| 2003/0040192 A1 | 2/2003 | Kanegae | |
| 2005/0112891 A1 | 5/2005 | Johnson et al. | |
| 2005/0266691 A1 * | 12/2005 | Gu et al. ................ | 438/706 |
| 2007/0049018 A1 | 3/2007 | Sandhu et al. | |
| 2007/0077780 A1 * | 4/2007 | Wang et al. ............ | 438/780 |
| 2007/0228002 A1 | 10/2007 | Geng et al. | |

FOREIGN PATENT DOCUMENTS

EP 1336984 * 8/2003

OTHER PUBLICATIONS

S. Stanley, $5^{th}$ International Conference on Plasma Process Induced Damage, May (2000), American Vacuum Society, pp. 50-53.*
L. Jian, Proceedings of the international Confernece on MEMS, NANO and Smart Systems (2003) IEEE, pp. 1-5.*
International Search Report dated May 19, 2008 from International Application No. PCT/US2008/052944.
Written Opinion dated May 19, 2008 from International Application No. PCT/US2008/052944.
International Search Report dated May 26, 2008 from International Application No. PCT/US2008/052950.
Written Opinion dated May 26, 2008 from International Application No. PCT/US2008/052950.
Office Action dated Mar. 6, 2008 for U.S. Appl. No. 11/671,340.

* cited by examiner

*Primary Examiner*—Nadine Norton
*Assistant Examiner*—Maki Angadi
(74) *Attorney, Agent, or Firm*—Beyer Law Group LLP

(57) ABSTRACT

A method for selectively etching an ultra high aspect ratio feature dielectric layer through a carbon based mask in an etch chamber is provided. A flow of an etch gas is provided, comprising a fluorocarbon containing molecule and an oxygen containing molecule to the etch chamber. A pulsed bias RF signal is provided. An energizing RF signal is provided to transform the etch gas to a plasma.

18 Claims, 6 Drawing Sheets

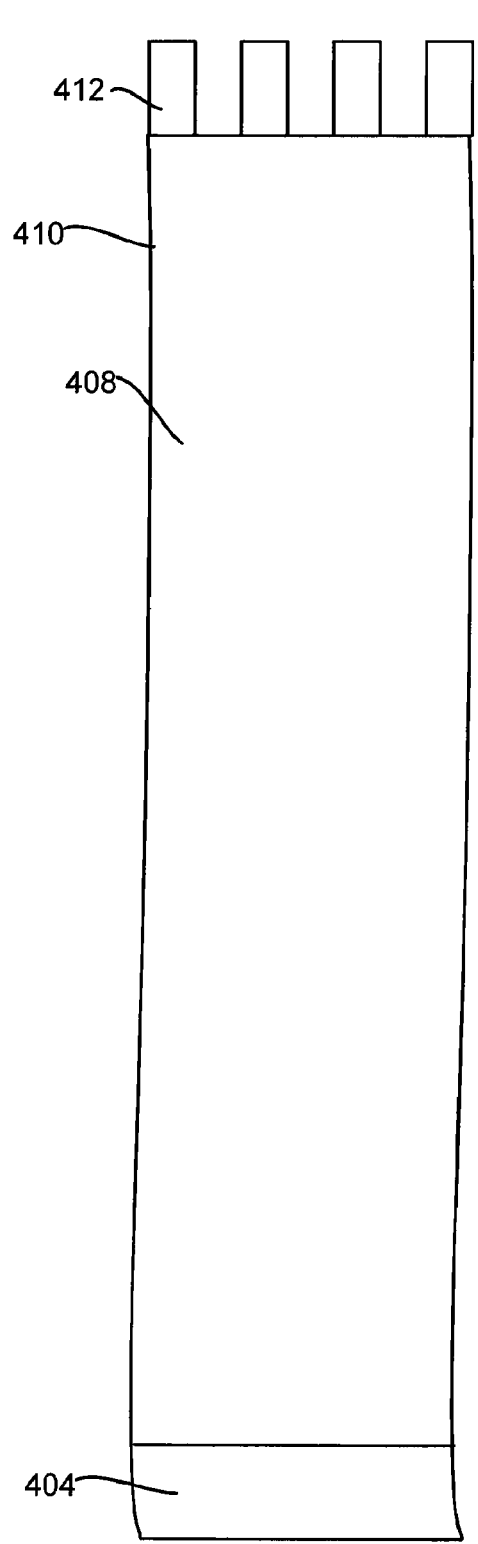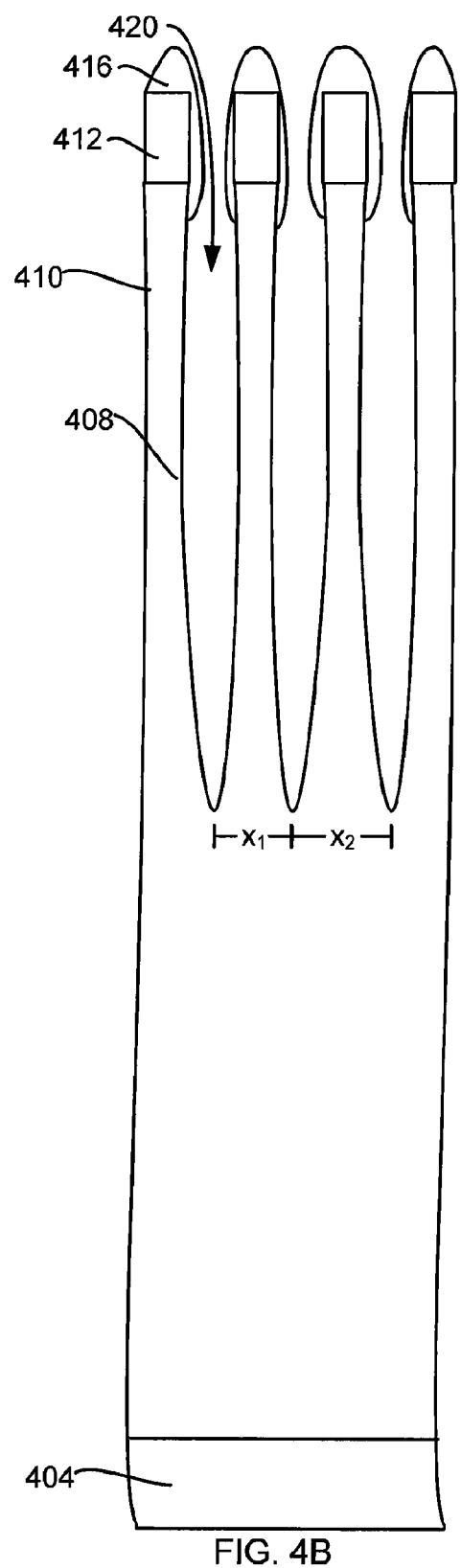
FIG. 4A
FIG. 4B

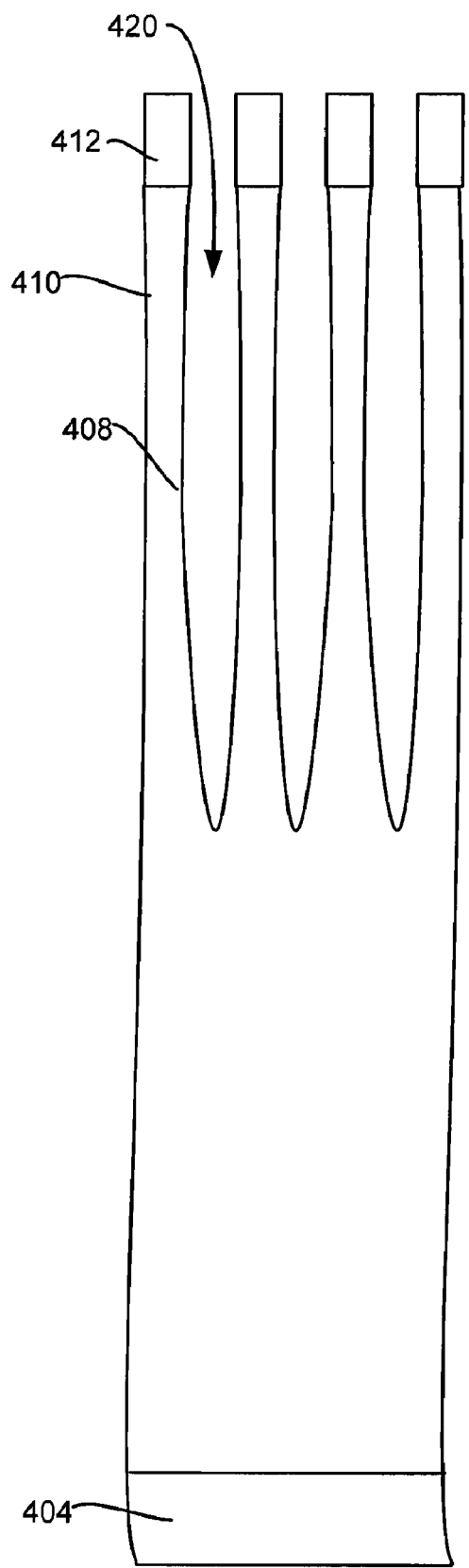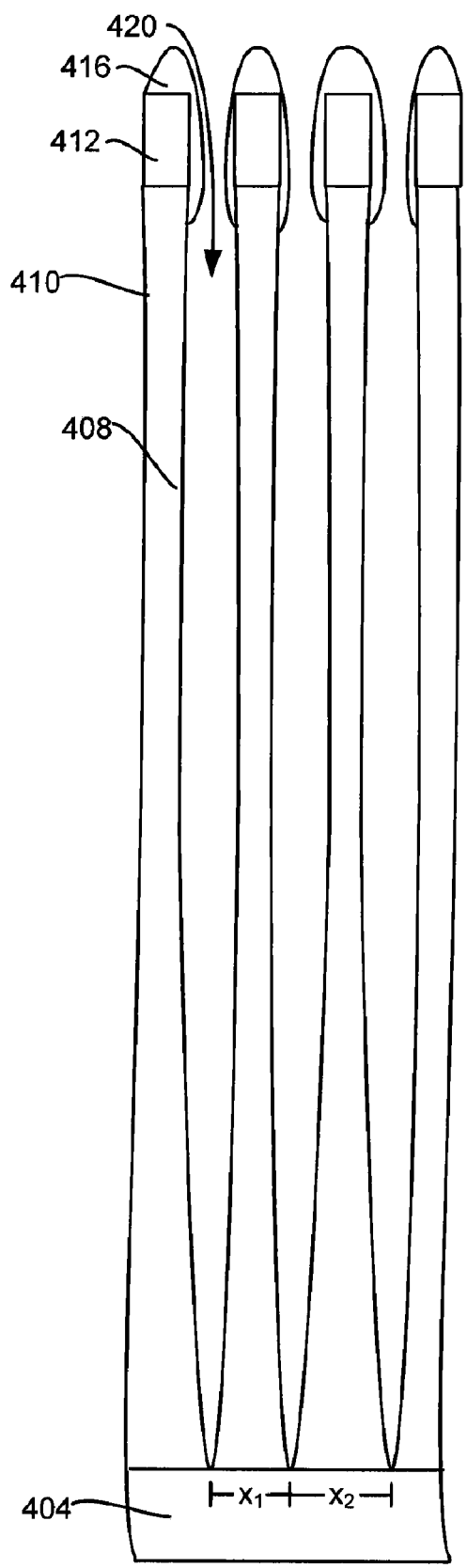
FIG. 4C
FIG. 4D

PULSED ULTRA-HIGH ASPECT RATIO DIELECTRIC ETCH

BACKGROUND OF THE INVENTION

The present invention relates to the fabrication of semiconductor devices. More specifically, the present invention relates to the fabrication of semiconductor devices, which use ultra high aspect ratio features.

Plasma-etching processes are commonly used in the fabrication of semiconductor devices. Generally, photoresist material forms feature patterns on the surface of the wafer to be etched, and features are then etched into the wafer by exposing the wafer to a particular type of etching gas. One of the challenges faced in plasma etching is the ever-increasing aspect ratio needed to meet design requirements, especially for ultra-high density structures. When etching features on semiconductor wafers, the aspect ratio of an etched feature is defined as the ratio between the feature's depth and the feature's critical dimension (CD). As more features are packed on a single piece of wafer to create higher density structures, the CD of each individual feature necessarily decreases, while the depth of the features remains unchanged. Thus, the aspect ratio of each individual feature increases as the device feature shrinks.

A difficulty found is a change in an ellipse ratio during etching.

SUMMARY OF THE INVENTION

To achieve the foregoing and in accordance with the purpose of the present invention, a method for selectively etching an ultra high aspect ratio feature dielectric layer through a carbon based mask in an etch chamber is provided. A flow of an etch gas is provided, comprising a fluorocarbon containing molecule and an oxygen containing molecule to the etch chamber. A pulsed bias RF signal is provided. An energizing RF signal is provided to transform the etch gas to a plasma.

In another manifestation of the invention a method for selectively etching an ultra high aspect ratio feature dielectric layer through a carbon based mask in an etch chamber is provided. A flow of an etch gas, comprising a fluorocarbon containing molecule and an oxygen containing molecule is provided to the etch chamber. A pulsed bias RF signal is provided. An energizing RF signal is provided to transform the etch gas to a plasma.

In another manifestation of the invention an apparatus for etching UHAR features in an etch layer below an carbon based mask is provided. A plasma processing chamber, comprises a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, an RF bias source providing a signal with a RF frequency between 1 kHz and 10 MHZ, a pulse generation device that is able to pulse the RF bias source, connected to the RF bias source, a first RF excitation source providing a signal with a RF frequency between 1 MHz and 5 MHz, a second RF excitation source providing a signal with a RF frequency between 10 MHz and 40 MHz, a gas inlet for providing gas into the plasma processing chamber enclosure, and a gas outlet for exhausting gas from the plasma processing chamber enclosure. A gas source is in fluid connection with the gas inlet, comprising an oxygen source and a fluorocarbon polymer gas source. A controller is controllably connected to the gas source, the RF bias source, the first RF excitation source, and the second RF excitation source and the at least one electrode and comprises at least one processor and computer readable media comprising computer readable code for providing a selective etch of the dielectric layer with respect to the carbon based mask, where the first selective etch provides a net deposition of a fluorocarbon based polymer. The computer readable code for providing a selective etch of the dielectric layer comprise computer readable code for providing a flow of an etch gas comprising oxygen from the oxygen source and a fluorocarbon polymer gas from the fluorocarbon polymer gas source to the processing chamber enclosure, computer readable code for energizing the RF bias source, computer readable code for pulsing the RF bias source, and computer readable code for energizing the first RF excitation source and the second RF excitation source to provide energy, to form a plasma from the etch gas and polymer forming gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 4A-D are schematic cross-sectional views of a layer etched according to an embodiment of the invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Twisting occurs during the etching of ultra-high aspect ratio (UHAR) features, such as holes. Without wishing to be bound by the following, it is tentatively theorized that the twisting is a result of asymmetric etching. There are several possible mechanisms contributing to asymmetric etching as the feature aspect ratio increases. One mechanism that has been discovered is that during etches that deposit a net fluorocarbon polymer layer over a mask, the fluorocarbon polymer are deposited asymmetrically (nonuniformly).

For some UHAR features, an elliptical cross-section is desired, to allow closer spacing of contacts. Such an elliptical cross-section has a length and a width, where the diameter of the ellipse is the length of the ellipse. An ellipse ratio is defined as the ratio of the length to the width. Another distortion found in etching of such UHAR features is the tendency for the ellipse ratio to increase, in that the length of the ellipse may increase while the width decreases.

The invention provides an apparatus and a method for reducing twisting in UHAR dielectric etch. During the fabrication of semiconductor devices, often features are etched through a mask into a layer to be etched over a substrate. The aspect ratio of a feature is the depth-to-width ratio of the feature opening. In the specification and claims, an ultra-high aspect ratio (UHAR) for a feature for this invention is defined as a depth-to-width ratio greater than 25 to 1. More preferably, an UHAR for a feature for this invention is defined as at least 30 to 1. Most preferably, an UHAR is defined as at least 40 to 1. In addition, preferably, the present invention applies to etching features in the dielectric layer with a width of no more than 300 nanometers (nm). More preferably, the present invention applies to etching features in the dielectric layer with a width of no more than 200 nm. Most preferably, the present invention applies to etching features in the dielectric layer with a width of no more than 150 nm.

Preferably, the present invention applies to any dielectric etch. More preferably, the present invention applies to dielectric etch where the dielectric layer is silicon oxide or silicon nitride based. In other words, the dielectric layer is formed mainly of silicon oxide or silicon nitride with smaller amounts of other types of material mixed in.

Figure 1:
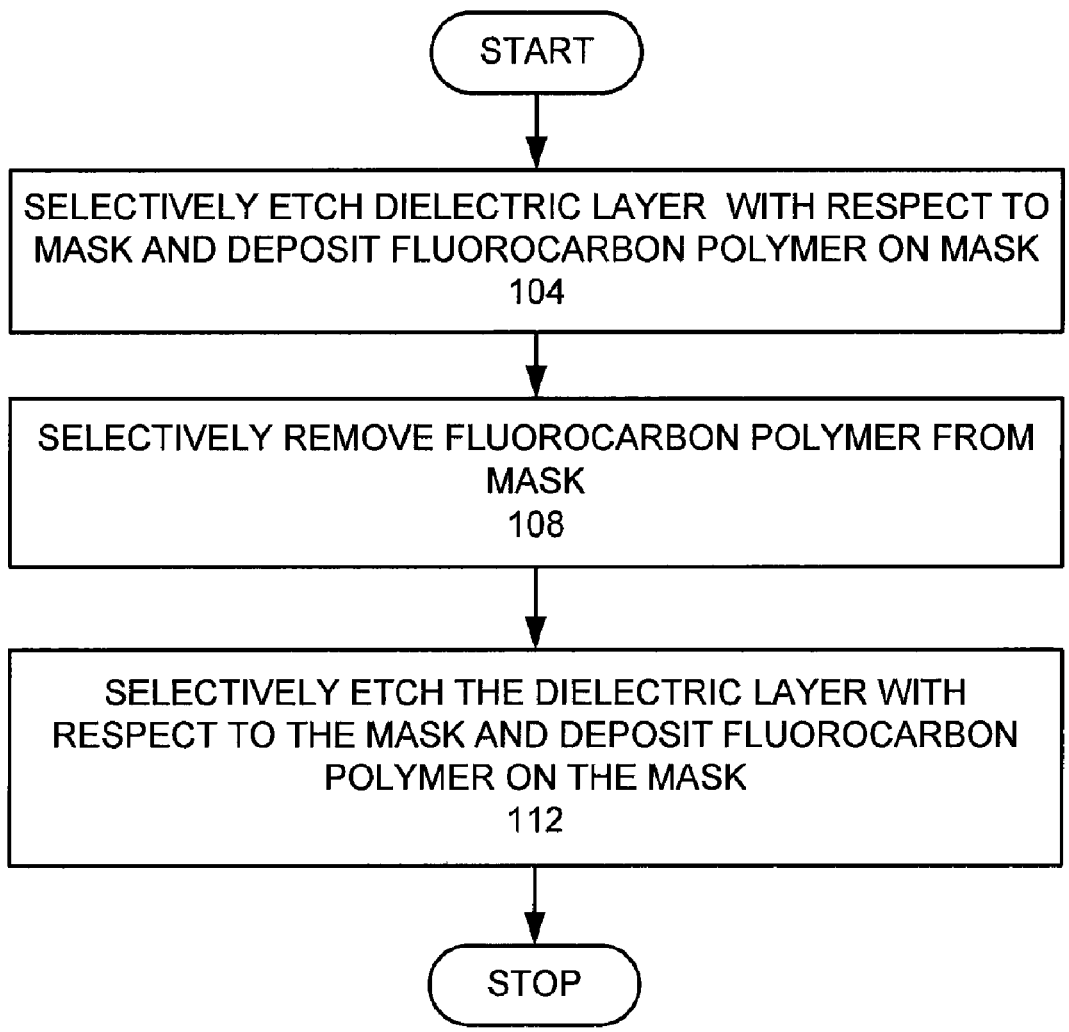
FIG. 1 is a high level flow chart of an embodiment of the invention.

FIG. 1 is a high level flow chart of an embodiment of the invention. A dielectric layer is selectively etched with respect to a carbon based mask, where a fluorocarbon based polymer is net deposited on the carbon based mask (step 104). A net deposition means that more polymer is deposited than removed, so that a growing fluorocarbon polymer layer is deposited. Generally, an etching gas is provided. The etching gas is fed into a plasma, which provides the selective etching. While the etch process is stopped, the fluorocarbon polymer is selectively removed partially or completely from the carbon based mask (step 108). Generally, a trimming gas, such as an oxygen or fluorine containing flashing gas, such as $O_2$, or $CF_4$ is provided. The trimming gas is then formed into a plasma which ashes or trims the fluorocarbon polymer more quickly than the carbon based mask. The selective removal of the fluorocarbon polymer with respect to the carbon based mask is stopped. A subsequent selective etching of the dielectric layer is provided, where the second selective etching provides a net deposition of a fluorocarbon based polymer on the carbon mask (step 112). More specific implementations of the above embodiment are described below.

Figure 2:
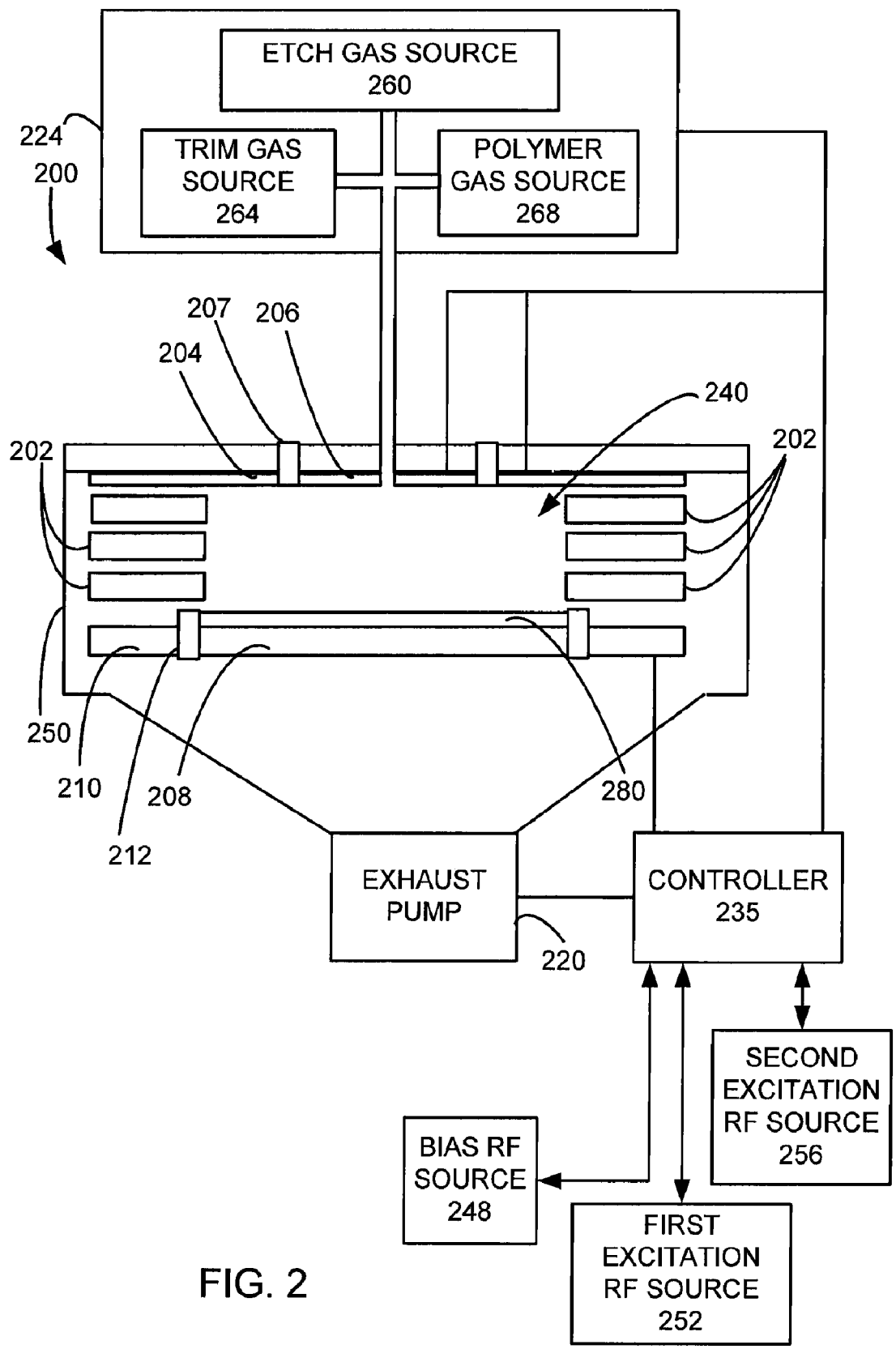
FIG. 2 is a schematic view of an etch reactor that may be used in practicing the invention.

FIG. 2 is a schematic view of an etch reactor that may be used in practicing the invention. In one or more embodiments of the invention, an etch reactor 200 comprises a top central electrode 206, top outer electrode 204, bottom central electrode 208, and a bottom outer electrode 210, within a chamber wall 250. A top insulator ring 207 insulates the top central electrode 206 from the top outer electrode 204. A bottom insulator ring 212 insulates the bottom central electrode 208 from the bottom outer electrode 210. Also within the etch reactor 200, a substrate 280 is positioned on top of the bottom central electrode 208. Optionally, the bottom central electrode 208 incorporates a suitable substrate chucking mechanism (e.g., electrostatic, mechanical clamping, or the like) for holding the substrate 280.

A gas source 224 is connected to the etch reactor 200 and supplies the etch gas into the etch reactor 200 during the etch processes. In this example, the gas source 224 comprises an etch gas source 260, a trim gas source 264, and a polymer gas source 268 for providing a fluorocarbon polymer deposition during the etching.

A bias RF source 248, a first excitation RF source 252, and a second excitation RF source 256 are electrically connected to the etch reactor 200 through a controller 235 to provide power to the electrodes 204, 206, 208, and 210. The bias RF source 248 generates bias RF power and supplies the bias RF power to the etch reactor 200. Preferably, the bias RF power has a frequency between 1 kilo Hertz (kHz) and 10 mega Hertz (MHz). More preferably, the bias RF power has a frequency between 1 MHz and 5 MHz. Even more preferably, the bias RF power has a frequency of about 2 MHz.

The first excitation RF source 252 generates source RF power and supplies the source RF power to the etch reactor 200. Preferably, this source RF power has a frequency that is greater than the bias RF power. More preferably, this source RF power has a frequency that is between 10 MHz and 40 MHz. Most preferably, this source RF power has a frequency of 27 MHz.

The second excitation RF source 256 generates another source RF power and supplies the source RF power to the etch reactor 200, in addition to the RF power generated by the first excitation RF source 252. Preferably, this source RF power has a frequency that is greater than the bias RF source and the first RF excitation source. More preferably, the second excitation RF source has a frequency that is greater than or equal to 40 MHz. Most preferably, this source RF power has a frequency of 60 MHz.

The different RF signals may be supplied to various combinations of the top and bottom electrodes. Preferably, the lowest frequency of the RF should be applied through the bottom electrode on which the material being etched is placed, which in this example is the bottom central electrode 208.

The controller 235 is connected to the gas source 224, the bias RF source 248, the first excitation RF source 252, and the second excitation RF source 256. The controller 235 controls the flow of the etch gas into the etch reactor 200, as well as the generation of the RF power from the three RF sources 248, 252, 256, the electrodes 204, 206, 208, and 210, and the exhaust pump.

In this example, confinement rings 202 are provided to provide confinement of the plasma and gas, which pass between the confinement rings and are exhausted by the exhaust pump.

Figure 3A:
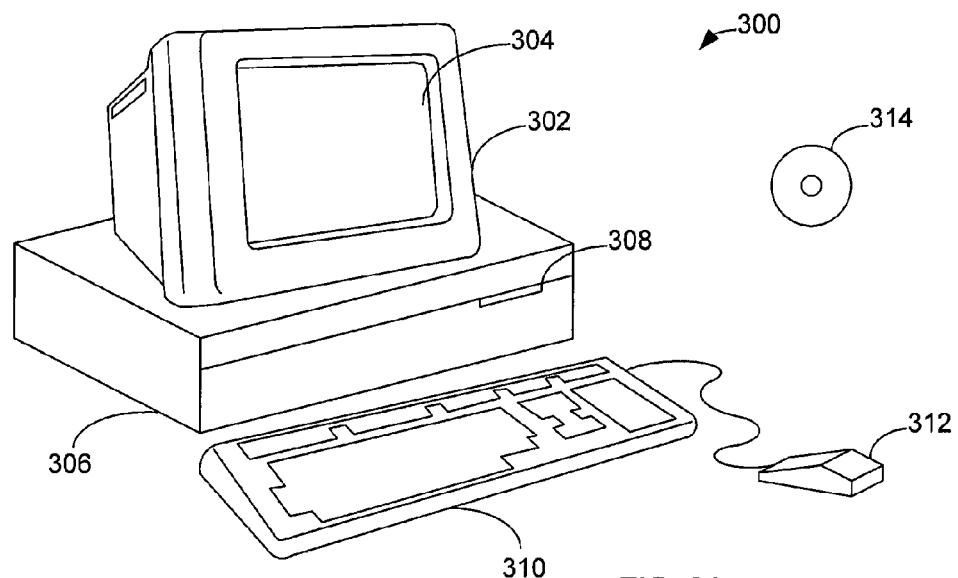
FIGS. 3A and 3B illustrate a computer system, which is suitable for implementing the controller used in one or more embodiments of the present invention.
Figure 3B:
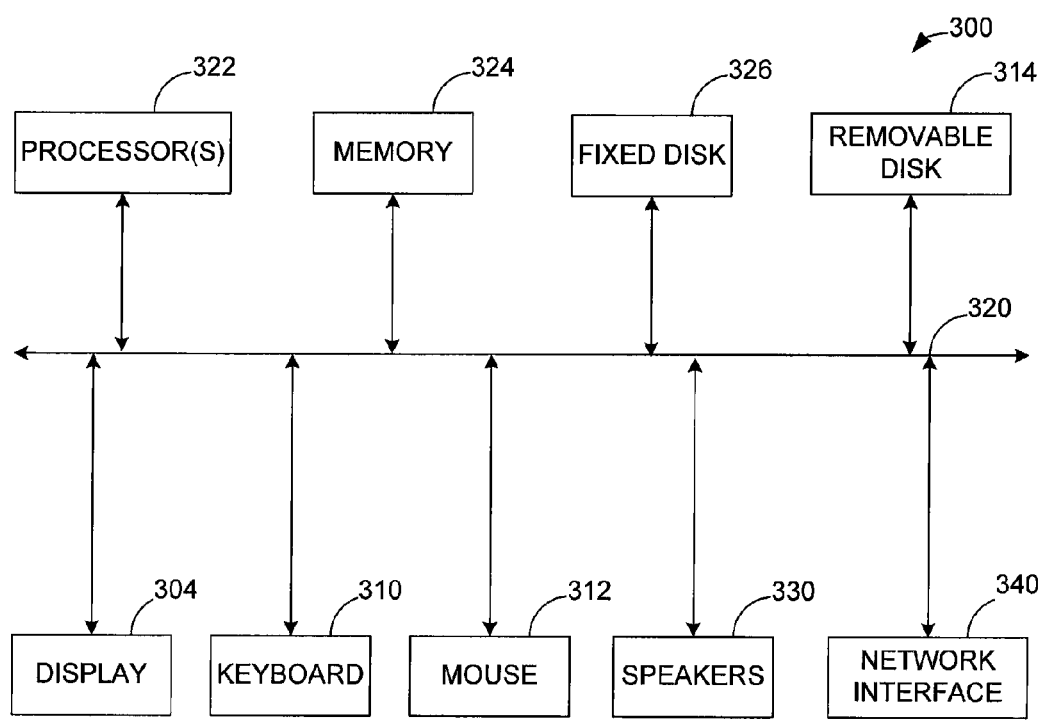

FIGS. 3A and 3B illustrate a computer system, which is suitable for implementing the controller 235 used in one or more embodiments of the present invention. FIG. 3A shows one possible physical form of the computer system 300. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 is a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices, such as display 304, keyboard 310, mouse 312 and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level of code that are executed by a computer using an interpreter. Computer readable media may also be computer code transmitted by a computer data signal embodied in a carrier wave and representing a sequence of instructions that are executable by a processor.

EXAMPLE

In a specific example of an embodiment of the invention, a substrate is provided over which a dielectric layer is formed over which a carbon based mask is formed. FIG. 4A is a schematic cross sectional view of the substrate 404, the dielectric layer 408, and the carbon based mask 412. Although the dielectric layer 408 in this example is shown to be on top of the substrate 404 and the carbon mask 412 is shown to be on the dielectric layer 408, one or more layers may be disposed between these layers, so that the dielectric layer is over the substrate 404 but not in direct contact with the substrate 404 and where the carbon based mask 412 is over the dielectric layer 408, but not in direct contact with the dielectric layer 408. In this example, the dielectric layer 408 is a single layer of a single uniform material.

In this example, the substrate 404 is a silicon wafer and the dielectric layer is a single layer of siliconoxide (SiO) or silicon nitride (SiN) based material. In this example, the carbon based mask is amorphous carbon, but in other examples the carbon based mask may be a photoresist polymer. Amorphous carbon is similar to a polymer, but with less hydrogen and more carbon, so that it is more etch resistant than polymer. In other embodiments, the mask may be photoresist.

The dielectric layer is selectively etched with respect to the carbon based mask, while depositing a net fluorocarbon polymer layer on the carbon based mask to provide an affordable selectivity (step 104). An example of such an etch for a $SiO_2$ dielectric layer, an etch and polymer gas of 200 sccm Ar, 20 sccm $C_4F_8$, 82 sccm $C_4F_6$, and 64 sccm $O_2$ are provided to the interior of the etch chamber 240 from the etch gas source 260 and polymer gas source 268. The bias RF source provides 4,000 Watts (W) at 2 MHz. The first excitation RF source provides 150 W at 27 MHz. The second excitation RF source provides 500 W at 60 MHz. The etch and polymer gas is transformed into a plasma. A pressure of 25 mTorr is maintained. The etch is maintained for 300 seconds to etch to a depth of about 1500 nm. The etch is then stopped.

FIG. 4B is a schematic cross-sectional view after the selective etch. The selective etch provides a net fluorocarbon polymer deposition 416 on the mask 412, while features 420 have been partially etched. It has been unexpectedly found that the fluorocarbon polymer deposition tends to be asymmetric in such a way that one side that receives more deposition will continue to receive more deposition thus becoming even more asymmetric. Such an asymmetric deposition is a source of twisting, in that the centers of the bottoms of the etch features are unequally spaced. To facilitate understanding, the FIG. 4B shows the bottom of two features being separated by a distance $x_1$ and the bottom of two features being separated by a distance $x_2$, which is greater than $x_1$.

The fluorocarbon polymer is selectively removed from the mask (step 108). An example of such a selective removal, an ashing or trim gas of 400 sccm Ar and 10 sccm $O_2$ are provided to the interior of the etch chamber 240 from the trim gas source 264. The bias RF source provides 300 W at 2 MHz. The first excitation RF source provides 100 W at 27 MHz. The second excitation RF source provides 200 W at 60 MHz. The trim gas is transformed into a plasma. A pressure of 20 mTorr is maintained. The removal is maintained for 25 seconds. The removal process is then stopped. The $O_2$ allows for the ashing of the polymer. The Ar may provide some bombardment, but most of the removal is done by the $O_2$.

FIG. 4C is a schematic cross-sectional view after the fluorocarbon polymer removal, which reshapes the mask. The reshaped mask is patterned more correctly, since the asymmetric fluorocarbon polymer has been removed. The process also opens the mask features to closer to their original widths.

The dielectric layer is again selectively etched with respect to the carbon based mask, while depositing a net fluorocarbon polymer layer on the carbon based mask to provide an infinite selectivity (step 112). An example of such an etch for a $SiO_2$ dielectric layer, an etch and polymer gas of 200 sccm Ar, 20 sccm $C_4F_8$, 82 sccm $C_4F_6$, and 64 sccm $O_2$ are provided to the interior of the etch chamber 240 from the etch gas source 260 and polymer gas source 268. The bias RF source provides 4,000 Watts (W) at 2 MHz. The first excitation RF source provides 150 W at 27 MHz. The second excitation RF source provides 500 W at 60 MHz. The etch and polymer gas is transformed into a plasma. A pressure of 25 mTorr is maintained. The etch is maintained until the dielectric layer is completely etched. The etch is then stopped.

FIG. 4D is a schematic cross-sectional view after the selective etch. The selective etch provides a net fluorocarbon polymer deposition 416 on the mask 412, while features 420 have been partially etched. The fluorocarbon polymer deposition tends to be asymmetric in such a way that one side that receives more deposition will continue to receive more deposition. Such an asymmetric deposition is a source of twisting, in that the centers of the bottoms of the etch features are unequally spaced. To facilitate understanding, the FIG. 4D shows the bottom of two features being separated by a distance $x_1$ and the bottom of two features being separated by a distance $x_2$, which is greater than $x_1$.

By providing the selective removal of the fluorocarbon polymer from the mask, resulting in mask reshaping, the twisting is reduced. For example, without the mask reshaping the differences between $x_1$ and $x_2$ may be doubled.

In the above example, a 30:1 aspect ratio was achieved for a 2.1 µdepth etch. A 40:1 aspect ratio was achieved for a 3 µdepth etch.

Figure 5:
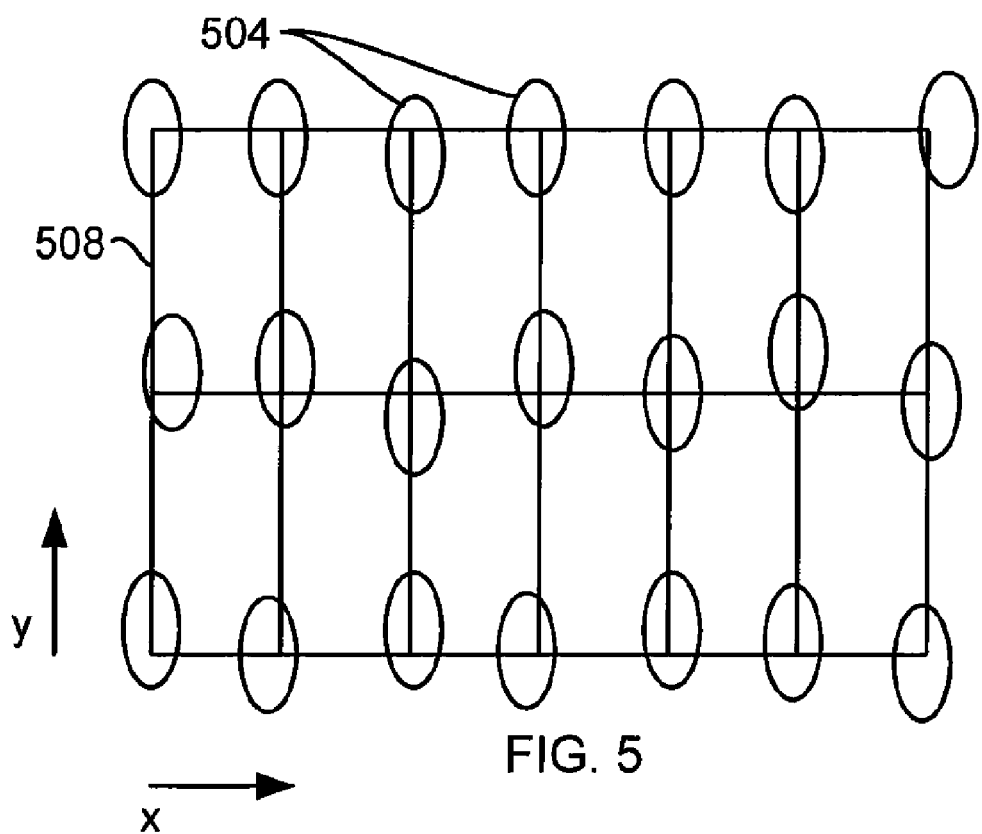
FIG. 5 is a schematic view that illustrates the measuring the amount of twisting.

FIG. 5 is a schematic view useful for measuring the amount of twisting. The ellipses 504 schematically illustrate the bottoms of etch features. The grid 508 illustrates the locations of centers of the features of the layout of the original mask, where the center of each feature is at a grid point. As illustrated, the centers of the ellipses 504 of the bottoms of the etch features are not all aligned with the grid points. In this example, to measure twisting, a twisting in the x direction is determined by using an average of the root mean square (rms) of the difference between the center of the ellipse and the related grid point in the x direction and a twisting in the y direction is determined by using an average of the rms of the difference between the center of the ellipse and the related grid point in the y direction and a total twisting is the rms distance between the center of the ellipse and the related grid point.

A layout provides features with a twisting in the x direction of 2.40 nm. A control that used etching alone was found to have a twisting in the x direction of 6.4 nm. In the above example using a selective removal of the fluorocarbon polymer from the mask, a twisting was measured to be 4.03 nm.

The features are elliptical to allow closer placement of the features in the x direction, as shown. Because the features are closer together in the x direction the distances are more critical in the x direction, providing smaller tolerances in the x direction.

Pulsing Example

In another example, the dielectric layer is selectively etched with respect to the carbon based mask, while depositing a net fluorocarbon polymer layer on the carbon based mask to provide an infinite selectivity (step 104). An example of such an etch for a $SiO_2$ dielectric layer, an etch and polymer gas of 200 sccm Ar, 20 sccm $C_4F_8$, 82 sccm $C_4F_6$, and 64 sccm $O_2$ are provided to the interior of the etch chamber 240 from the etch gas source 260 and polymer gas source 268. The bias RF source provides 4,000 Watts (W) at 2 MHz. The first excitation RF source provides 150 W at 27 MHz. The second excitation RF source provides 500 W at 60 MHz. The etch and polymer gas is transformed into a plasma. A pressure of 25 mTorr is maintained. The etch is maintained for 240 seconds. The etch is then stopped.

The fluorocarbon polymer is selectively removed from the mask (step 108). An example of such a selective removal, an ashing or trim gas of 400 sccm Ar and 10 sccm $O_2$ are provided to the interior of the etch chamber 240 from the trim gas source 264. The bias RF source provides 300 W at 2 MHz. The first excitation RF source provides 100 W at 27 MHz. The second excitation RF source provides 200 W at 60 MHz. The trim gas is transformed into a plasma. A pressure of 20 mTorr is maintained. The removal is maintained for 25 seconds. The removal process is then stopped.

The dielectric layer is again selectively etched with respect to the carbon based mask (step 112). In this example the bias RF source is pulsed. In an example of such an etch for a $SiO_2$ dielectric layer, an etch and polymer gas of 200 sccm Ar, 20 sccm $C_4F_8$, 82 sccm $C_4F_6$, and 70 sccm $O_2$ are provided to the interior of the etch chamber 240 from the etch gas source 260 and polymer gas source 268. The bias RF source provides 4,000 Watts (W) at 2 MHz, where the bias signal is pulsed with an 80 µs duty cycle at 50%. The first excitation RF source provides 150 W at 27 MHz. The second excitation RF source provides 500 W at 60 MHz. The etch and polymer gas is transformed into a plasma. A pressure of 25 mTorr is maintained. The pulsed etch is maintained until the dielectric layer is completely etched, which in this example is 600 seconds. The pulsed etch is then stopped. This step provides more oxygen than a similar non-pulsed step, since the pulsed process provides more polymerization and therefore more oxygen is needed to reduce polymerization.

Figure 6:
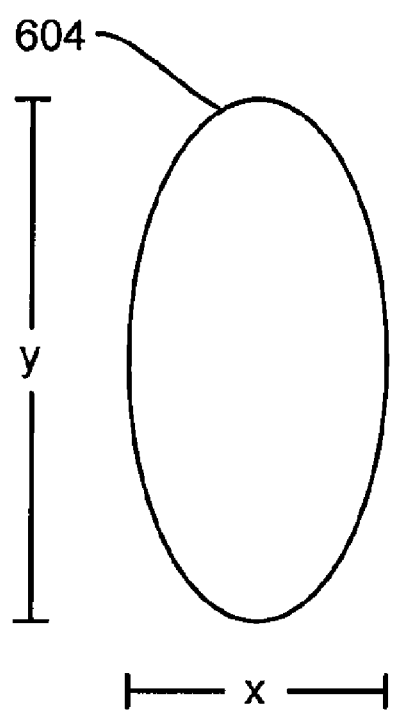
FIG. 6 is a schematic view of an ellipse.

FIG. 6 is a schematic view of an ellipse 604 with a length y and a width x. An ellipse ratio is defined by the ratio of the length to the width y/x. The ellipse ratio of the layout features is 1.69. In a control test where a nonpulsed bias RF was used an ellipse ratio was found to be 3.11. It has been found that under normal etch conditions, the cross section of the feature tends to increase in length and shorten in width causing the ellipse ratio to increase. It has been unexpectedly found that, although pulsing increases etch time, by slowing down the etch process, the ellipse ratio is decreased. In the above example, the ellipse ratio was found to be 1.94.

In another embodiment using the pulsed etch, such as when the CD of the etched features are large, twisting may not be a concern. In such a case, the pulsed bias during an etch may be used without the step of selective removal of the fluorocarbon polymer with respect to the mask. Such an etch may use the pulsed etch during the entire etch processes.

Preferably the selective etching of the dielectric layer with respect to the mask has a selectivity greater than 3 to 1. More preferably, the selectivity is greater than 5 to 1. Most preferably, the selectivity is an infinite selectivity.

Preferably, the selective removal of the fluorocarbon polymer with respect to the carbon based mask is at least 2 to 1. More preferably, the selectivity if at least 1.3 to 1. Most preferably, the selectivity is at least 1.1 to 1.

The dielectric layer may be made of one of many various dielectric materials such as silicon nitride based, silicon oxide base, various organic or inorganic low-k dielectrics.

While the above example provided two selective etches with a selective removal of the fluorocarbon polymer from the mask in between, other examples may provide more selective etches with selective removal of the fluorocarbon polymer in between. For example, five selective etches may be used requiring a total of three selective removals of fluorocarbon polymer. Such a process may increase processing time, but would further decrease twisting. Too many selective removals of the fluorocarbon polymer may undesirably remove too much of the carbon based mask.

The selective etching of the dielectric requires providing an etch and polymer gas which comprises either a fluorocarbon or a hydrofluorocarbon gas. More preferably the etch and polymer gas comprises a fluorocarbon gas. More preferably the etch and polymer gas further comprises an oxygen containing gas, which may be $CO_2$ or $O_2$, and is preferably $O_2$.

More preferably, the etch and polymer gas further comprises a bombardment gas, such as Ar.

To increase the selectivity of the removal of the fluorocarbon polymer with respect to the carbon based mask, it is more preferable for the carbon based mask to be an amorphous carbon mask.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching an ultra high aspect ratio feature dielectric layer through a carbon based mask in an etch chamber, comprising:
   a selective etching the dielectric layer with respect to the carbon based mask, wherein the selective etching provides a net deposition of a fluorocarbon based polymer on the carbon based mask;
   stopping the selective etch; and
   a subsequent selective etching the dielectric layer with respect to the carbon based mask, comprising:
      providing a flow of an etch gas, comprising a fluorocarbon containing molecule and an oxygen containing molecule to the etch chamber;
      providing a pulsed bias RF signal; and
      providing an energizing RF signal.

2. The method, as recited in claim 1, wherein the selective etching the dielectric layer with respect to the carbon based mask, comprises:
   providing a flow of an etch gas and a fluorocarbon polymer gas to the etch chamber;
   providing a continuous wave bias RF signal; and
   providing an energizing RF signal.

3. The method, as recited in claim 2, wherein the carbon based mask is one of a photoresist and amorphous carbon.

4. The method, as recited in claim 2, wherein the carbon based mask is amorphous carbon.

5. The method, as recited in claim 4, wherein the ultra high aspect ratio feature has an aspect ratio of at least 30:1.

6. The method, as recited in claim 4, wherein the selective etching has a selectivity greater than 3 to 1.

7. The method, as recited in claim 6, wherein the subsequent selective etching has a selectivity greater than 3 to 1.

8. The method, as recited in claim 4, wherein the selective etching has a selectivity greater than 5 to 1.

9. The method, as recited in claim 8, wherein the subsequent selective etching has a selectivity greater than 5 to 1.

10. The method, as recited in claim 4, wherein the selective etching has an infinite selectivity.

11. The method, as recited in claim 10, wherein the subsequent selective etching has an infinite selectivity.

12. The method, as recited in claim 1, wherein the dielectric layer is a silicon oxide or silicon nitride based layer.

13. The method, as recited in claim 12, wherein the dielectric layer is a single uniform layer.

14. A method for selectively etching an ultra high aspect ratio feature dielectric layer through a carbon based mask in an etch chamber, comprising:
   providing a flow of an etch gas, comprising a fluorocarbon containing molecule and an oxygen containing molecule to the etch chamber;
   providing a pulsed bias RF signal;
   providing an energizing RF signal to transform the etch gas to a plasma; and etching the carbon based mask until a feature has a high aspect ratio greater than 25.

15. The method, as recited in claim 14, wherein the carbon based mask is amorphous carbon.

16. The method, as recited in claim 15, wherein the ultra high aspect ratio feature has an aspect ratio of at least 30:1.

17. The method, as recited in claim 16, wherein the selective etching has an infinite selectivity.

18. The method, as recited in claim 17, wherein the dielectric layer is a single uniform silicon oxide or silicon nitride based layer.

* * * * *